United States Patent
Takeuchi et al.

(10) Patent No.: US 6,867,667 B2
(45) Date of Patent: Mar. 15, 2005

(54) PIEZOELECTRIC FILTER, COMMUNICATION DEVICE, AND METHOD FOR MANUFACTURING COMMUNICATION DEVICE

(75) Inventors: Masaki Takeuchi, Otsu (JP); Hideki Kawamura, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 50 days.

(21) Appl. No.: 10/290,499

(22) Filed: Nov. 8, 2002

(65) Prior Publication Data

US 2003/0098761 A1 May 29, 2003

(30) Foreign Application Priority Data

Nov. 29, 2001 (JP) ......................................... 2001-365218
May 28, 2002 (JP) ......................................... 2002-154255

(51) Int. Cl.$^7$ .......................... H03H 9/205; H03H 9/56; H03H 9/70; H03H 3/02
(52) U.S. Cl. ....................... 333/189; 333/133; 310/312; 29/25.35
(58) Field of Search ................................. 333/186–192, 333/133; 310/312, 324; 29/25.35

(56) References Cited

U.S. PATENT DOCUMENTS

| | | | |
|---|---|---|---|
| 5,910,756 A | 6/1999 | Ella | 333/133 |
| 6,377,136 B1 * | 4/2002 | Rittenhouse et al. | 333/188 |
| 6,407,649 B1 * | 6/2002 | Tikka et al. | 333/133 |
| 6,469,597 B2 * | 10/2002 | Ruby et al. | 333/187 |
| 6,496,085 B2 * | 12/2002 | Ella et al. | 333/189 |
| 6,566,979 B2 * | 5/2003 | Larson et al. | 333/187 |
| 6,601,276 B2 * | 8/2003 | Barber | 29/25.35 |

FOREIGN PATENT DOCUMENTS

| | | |
|---|---|---|
| JP | 58-121815 | 7/1983 |
| JP | 6-29774 | 2/1994 |
| JP | 2001-326553 | 11/2001 |

* cited by examiner

Primary Examiner—Barbara Summons
(74) Attorney, Agent, or Firm—Keating & Bennett, LLP

(57) ABSTRACT

A piezoelectric filter includes a plurality of piezoelectric resonator portions each having a substrate, an $SiO_2$ layer, a piezoelectric thin-film, a lower electrode, and an upper electrode. The plurality of piezoelectric resonator portions include piezoelectric resonator portions having a relatively low frequency, and the lower electrodes of the piezoelectric resonator portions having a relatively low frequency have a thickness larger than that of lower electrodes of other piezoelectric resonator portions. A ladder-type piezoelectric filter, which is one of the communication devices, includes a plurality of parallel resonators and series resonators.

15 Claims, 12 Drawing Sheets

PIEZOELECTRIC FILTER, COMMUNICATION DEVICE, AND METHOD FOR MANUFACTURING COMMUNICATION DEVICE

BACKGROUND OF THE INVENTION

1. Field of the Invention

The present invention relates to a piezoelectric filter including a piezoelectric resonator having a substrate, such as a silicon wafer, and a piezoelectric thin-film disposed on the substrate, and also relates to a communication device and a method for manufacturing the piezoelectric filter.

2. Description of the Related Art

Piezoelectric resonators having a substrate, such as a silicon wafer, and a piezoelectric thin-film disposed on the substrate are disclosed in Japanese Unexamined Patent Application Publication No. 58-121815 and U.S. Pat. No. 5,910,756.

A piezoelectric resonator disclosed in Japanese Unexamined Patent Application Publication No. 58-121815 has a substrate having a recessed portion, a piezoelectric thin-film having a pair of electrodes and disposed on a surface of the substrate, and a frequency-adjusting thin-film disposed in the recessed portion located on the back of the surface of the substrate and located at an area corresponding to the piezoelectric thin-film, in order to control the resonant frequency.

In U.S. Pat. No. 5,910,756, a filter including a plurality of piezoelectric resonators connected to one another in a ladder configuration is disclosed, wherein the piezoelectric resonators each have two $SiO_2$ thin-films in order to control the resonant frequency.

In the configuration disclosed in Japanese Unexamined Patent Application Publication No. 58-121815, when the frequency is adjusted by trimming the frequency-adjusting thin-film in the recessed portion, the frequency-adjusting thin-film must be selectively formed on a desired area corresponding to the piezoelectric resonator via a deposition process. Since space is available between the substrate and a mask for forming the frequency-adjusting thin-film, a component for the frequency-adjusting thin-film is deposited on an area which must be isolated. Therefore, the selectivity of the film formation must be improved but it is difficult to do so which presents a significant problem. Since the frequency-adjusting thin-film is formed for each piezoelectric resonator one after another by deposition, the through-put is small. Therefore, there is a problem in that the productivity cannot be readily increased. Furthermore, when the frequency-adjusting thin-film includes metal, the upper and lower electrodes are electrically coupled with the metal frequency-adjusting thin-film. Therefore, there is a risk that the characteristics of the resonator are deteriorated.

On the other hand, in the configuration disclosed in U.S. Pat. No. 5,910,756, since it is difficult to widely control the resonant frequency with respect to the thickness of the $SiO_2$ layers, the second $SiO_2$ layer must have a certain thickness in order to obtain a desired difference between the frequency of resonators connected in parallel and that of resonators connected in series when a ladder filter is prepared. As a result, the resonators connected in parallel have a ratio of the frequency-adjusting thin-film thickness to the two $SiO_2$ layer thickness which is significantly different from that of the resonators connected in series. The resonators connected in parallel subsequently have the temperature characteristics of a resonant frequency which is significantly different from those of the resonators connected in series. Therefore, there is a problem in that the filter characteristics are significantly changed.

SUMMARY OF THE INVENTION

In order to solve the various problems described above, preferred embodiments of the present invention provide a piezoelectric filter, a communication device including such a piezoelectric filter, and a method for manufacturing the piezoelectric filter, wherein the piezoelectric filter has very high productivity, excellent electrical characteristics and very stable filter characteristics against temperature change.

According to a preferred embodiment of the present invention, a piezoelectric filter includes a plurality of piezoelectric resonator portions each including a substrate and a vibrating portion disposed on the substrate, having upper and lower electrodes and a thin-film portion disposed between the upper and lower electrodes, having a piezoelectric thin-film, wherein the plurality of piezoelectric resonator portions include piezoelectric resonator portions having a relatively low frequency, and the lower electrodes of the piezoelectric resonator portions having a relatively low frequency have a larger thickness than that of lower electrodes of other piezoelectric resonator portions.

A method for manufacturing the piezoelectric filter includes the step of forming the lower electrodes, wherein the time for forming the lower electrodes of the piezoelectric resonator portions having a relatively low frequency is longer than that required for forming lower electrodes of other piezoelectric resonator portions.

Since the lower electrodes of the piezoelectric resonator portions formed in the above-described manner have a thickness that is larger than that of the upper electrode, the thickness of the entire resonant region is increased and the mass is accordingly increased, thereby lowering the resonant frequency.

Preferred embodiments of the present invention provide a piezoelectric filter including a plurality of piezoelectric resonator portions each including a substrate and a vibrating portion disposed on the substrate, having upper and lower electrodes and a thin-film portion disposed between the upper and lower electrodes, having a piezoelectric thin-film, wherein the plurality of piezoelectric resonator portions include piezoelectric resonator portions having a relatively low frequency, and the upper electrodes of the piezoelectric resonator portions having a larger thickness than that of upper electrodes of other piezoelectric resonator portions.

In addition, another preferred embodiment of the present invention provides a method for manufacturing the piezoelectric filter including the step of forming the lower electrodes, wherein the time for forming the upper electrodes of the piezoelectric resonator portions having a relatively low frequency is longer than that required for forming upper electrodes of other piezoelectric resonator portions.

Since the upper electrodes of the piezoelectric resonator portions formed in the above-described manner have a thickness that is larger than that of the lower electrode, the thickness of the entire resonant region is increased and the mass is accordingly increased, thereby lowering the resonant frequency.

Another preferred embodiment of the present invention provides a piezoelectric filter including a plurality of piezoelectric resonator portions connected to one another so as to define a ladder configuration, each including a substrate and a vibrating portion disposed on the substrate, having upper and lower electrodes and a thin-film portion disposed between the upper and lower electrodes, having a piezoelectric thin-film, wherein the plurality of piezoelectric resonator portions include piezoelectric resonator portions connected in parallel and other piezoelectric resonator portions connected in series, the lower electrodes of the plurality of piezoelectric resonator portions have substantially the same thickness, and the upper electrodes of the parallel piezoelectric resonator portions have a thickness that is different from that of the upper electrodes of the series piezoelectric resonator portions. In the piezoelectric filter, the upper electrodes of the parallel piezoelectric resonator portions have a thickness that is larger than that of the upper electrodes of the series piezoelectric resonator portions.

In yet another preferred embodiment of the present invention, a method for manufacturing a piezoelectric filter having a ladder shape includes the steps of forming the upper electrodes such that the upper electrodes of the series piezoelectric resonator portions have a thickness that is different from that of the upper electrodes of the parallel piezoelectric resonator portions, and forming the lower electrodes at the same time so as to have substantially the same thickness. In the step of forming the upper electrodes having different thicknesses, the upper electrodes of the parallel piezoelectric resonator portions have a thickness that is larger than that of the upper electrodes of the series piezoelectric resonator portions.

Since the piezoelectric filter including the plurality of piezoelectric resonator portions connected in a ladder configuration is manufactured in the above-described manner such that the lower electrodes have substantially the same thickness, the step of forming the lower electrodes is greatly simplified.

According to a further preferred embodiment of the present invention, a piezoelectric filter includes a plurality of piezoelectric resonator portions connected to one another so as to define a ladder configuration, each including a substrate and a vibrating portion disposed on the substrate, having upper and lower electrodes and a thin-film portion, disposed between the upper and lower electrodes, having a piezoelectric thin-film, wherein the plurality of piezoelectric resonator portions include piezoelectric resonator portions connected in parallel and other piezoelectric resonator portions connected in series, the upper electrodes of the plurality of piezoelectric resonator portions have substantially the same thickness, and the lower electrodes of the parallel piezoelectric resonator portions have a thickness that is different from that of the lower electrodes of the series piezoelectric resonator portions. In the piezoelectric filter, when the upper electrodes have the same thickness, the lower electrodes of the parallel piezoelectric resonator portions may have a thickness that is larger than that of the lower electrodes of the series piezoelectric resonator portions.

In a preferred embodiment of the present invention, a method for manufacturing the piezoelectric filter having a ladder configuration includes the steps of forming the lower electrodes such that the lower electrodes of the series piezoelectric resonator portions have a thickness that is different from that of the lower electrodes of the parallel piezoelectric resonator portions, and forming the upper electrodes having substantially the same thickness at the same time. In the step of forming the lower electrodes having different thicknesses, the lower electrodes of the parallel piezoelectric resonator portions have a thickness that is larger than that of the lower electrodes of the series piezoelectric resonator portions.

Since the piezoelectric filter including the plurality of piezoelectric resonator portions connected in a ladder configuration is manufactured in the above-described manner such that the upper electrodes have substantially the same thickness, the step of forming the upper electrodes is greatly simplified.

In a piezoelectric filter of various preferred embodiments of the present invention, the substrate preferably has an opening or a recessed portion, and the vibrating portion is disposed in the opening or the recessed portion.

Another preferred embodiment of the present invention provides a communication device including at least one of the above-described piezoelectric filters. In the communication device, the piezoelectric filter is used for processing transmitting or receiving signals in a high-frequency circuit, thereby achieving the stable communication characteristics against change in the temperature of the surroundings.

In preferred embodiments of the present invention, the upper or lower electrode, which is different from the one disposed in the recessed portion, as disclosed in Japanese Unexamined Patent Application Publication No. 58-121815, is disposed on the substrate or the piezoelectric thin-film. Therefore, the pattern of the upper or lower electrode can be formed with high accuracy and high selectivity.

Since the upper and lower electrodes sandwich the piezoelectric thin-film therebetween and the frequency-adjusting thin-film is not used, the electrical coupling described above does not arise and therefore the characteristics are not deteriorated.

Since the upper and lower electrodes are in contact with the piezoelectric thin-film, change in the resonant frequency with respect to the thickness of the upper and lower electrodes can be increased. Therefore, the ratio of the thickness of the piezoelectric thin-film to the thickness of the upper or lower electrodes is not significantly changed, and the temperature characteristics of the resonant frequency of piezoelectric resonator portions having a relatively low resonant frequency and other piezoelectric resonator portions are not significantly changed, thereby obtaining the stable filter characteristics against change in temperature.

Other features, elements, characteristics, steps and advantages of the present invention will become more apparent from the following detailed description of preferred embodiments with reference to the attached drawings.

DETAILED DESCRIPTION OF THE PREFERRED EMBODIMENTS

First Preferred Embodiment

A configuration of a piezoelectric filter according to a first preferred embodiment will now be described with reference to FIGS. 1–3.

Figure 1A:
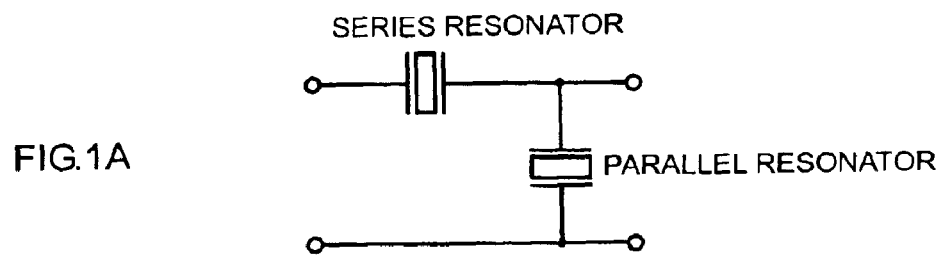
FIG. 1 is an illustration showing a fundamental circuit of a piezoelectric filter according to a first preferred embodiment and the equivalent circuit thereof.
Figure 1B:
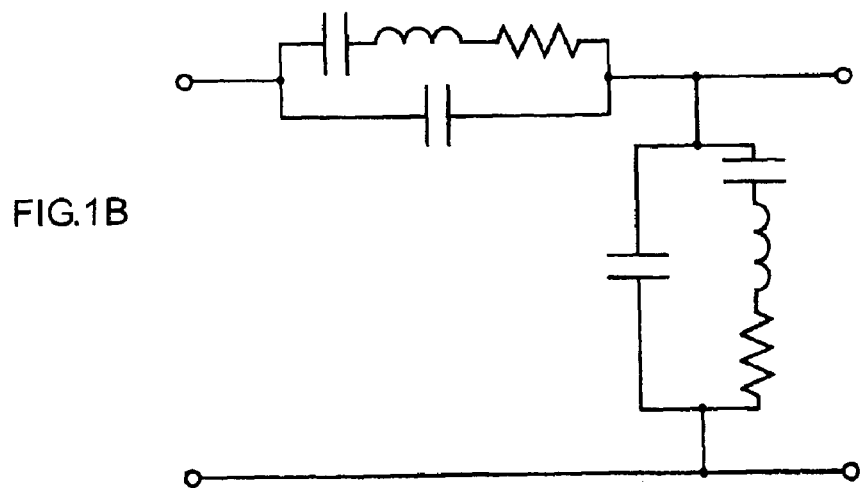

FIG. 1A is an illustration showing a circuit of a simple ladder-type piezoelectric filter and FIG. 1B is an illustration showing an equivalent circuit thereof. Both series and parallel resonators included in the filter are a piezoelectric type. As shown in FIG. 1B, these resonators each have an equivalent circuit including a capacitor, an inductor, and a resistor connected in series and another capacitor connected in parallel. The capacitor and the inductor connected in series generate series resonance, and the capacitor and the inductor connected in parallel generate parallel resonance.

Figure 2:
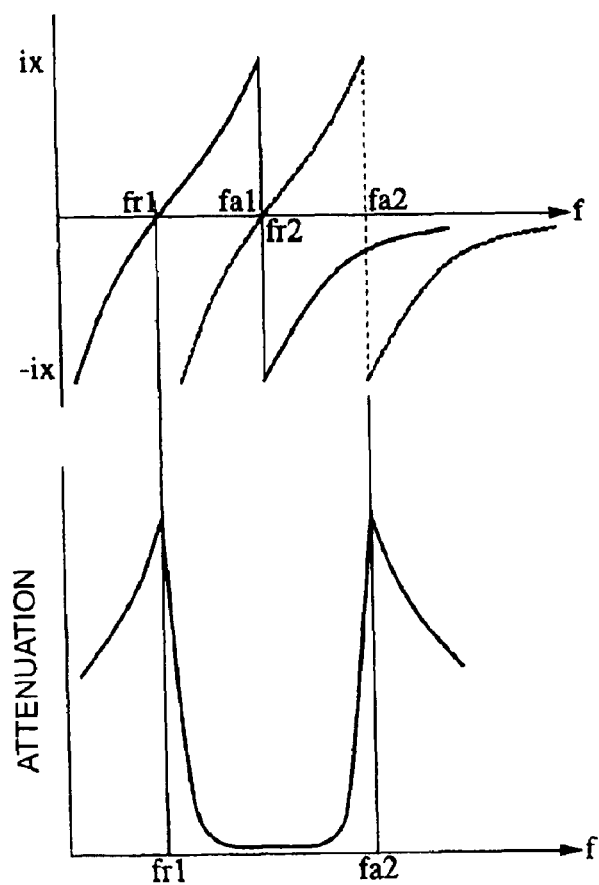
FIG. 2 is a graph showing a characteristic of the piezoelectric filter of FIG. 1.

FIG. 2 shows reactance characteristics of the series resonance generated by the series resonator and the parallel resonance generated by the parallel resonator in a superimposed manner. In the figure, the solid line represents the characteristic of the parallel resonator and the broken line represents the characteristic of the series resonator. Furthermore, fr1 represents the series resonant frequency of the parallel resonator, fa1 represents the parallel resonant frequency thereof, fr2 represents the series resonant frequency of the series resonator, and fa2 represents the parallel resonant frequency thereof. When fa1 and fr2 have substantially the same value and the series resonator and the parallel resonator are connected in a ladder shape, a band-pass characteristic in which fr1 and fa2 are attenuation poles and the portion therebetween is a pass band is obtained. In order to obtain such a band-pass characteristic, the parallel resonator must have a resonant frequency smaller than that of the series resonator.

Figure 3A:
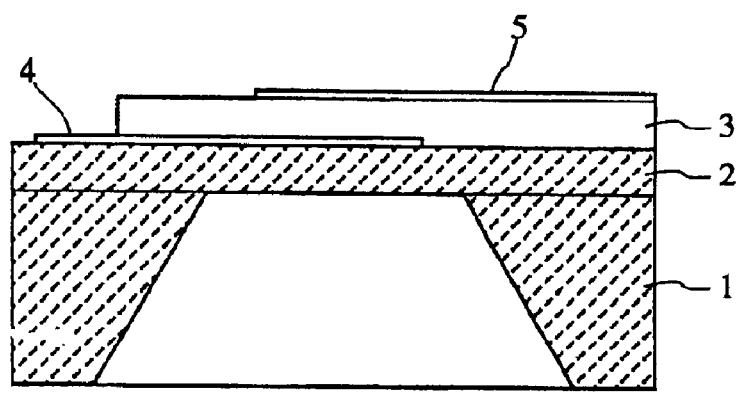
FIG. 3 is an illustration showing sectional views of a series resonator and a parallel resonator in the piezoelectric filter of FIG. 1.
Figure 3B:
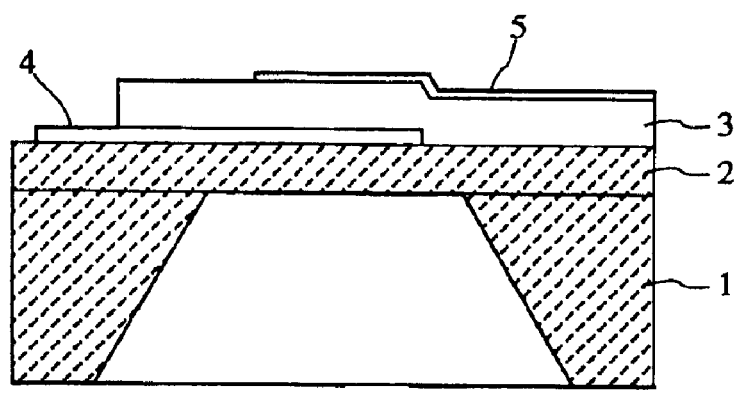

FIG. 3 shows sectional views of portions of the series resonator and the parallel resonator, which belong to a piezoelectric type. FIG. 3A shows a piezoelectric resonator portion (herein referred to as "a series resonator portion") in the series resonator, and FIG. 3B shows a piezoelectric resonator portion (herein referred to as "a parallel resonator portion") in the parallel resonator. The series and parallel resonator portions are provided on the same substrate and are separately shown in this figure.

In FIG. 3, reference numeral 1 represents a substrate prepared by cutting a silicon wafer into a filter unit. Reference numeral 2 represents a $SiO_2$ layer, reference numeral 3 represents a piezoelectric thin-film including, for example, ZnO, reference numeral 4 represents a lower electrode including, for example, Al, and reference numeral 5 represents an upper electrode including, for example, Al. In this preferred embodiment, a thin-film portion includes the piezoelectric thin-film 3 having a single layer. The thin-film portion may include a plurality of piezoelectric thin-films. The upper electrode 5 and the lower electrode 4 sandwich the piezoelectric thin-film 3 therebetween to form a vibrating portion.

The substrate 1 has a recessed portion on the back of a surface on which the $SiO_2$ layer 2 is disposed. The mass of the vibrating portion is adjusted by changing the size of the recessed portion to obtain a predetermined resonant frequency. The substrate 1 may have an opening on the lower surface in place of the recessed portion.

The lower electrode 4 of the parallel resonator portion shown in FIG. 3B has a thickness that is larger than that of the lower electrode 4 of the series resonator portion shown in FIG. 3A.

In each of the series and parallel resonator portions, a complex including the $SiO_2$ layer 2, the piezoelectric thin-film 3, the lower electrode 4, and the upper electrode 5 are arranged to vibrate in the thickness direction depending on the piezoelectric vibration of the piezoelectric thin-film 3.

As shown in FIG. 3, since the lower electrode 4 of the parallel resonator portion has a thickness that is larger than that of the lower electrode 4 of the series resonator portion, the thickness of an entire resonant region including the complex of the parallel resonator portion is larger than that of the series resonator portion. The mass of the resonant region of the parallel resonator portion is subsequently larger than that of the series resonator portion in proportion to the increase in the thickness of the lower electrode 4. Thus, the parallel resonator portion has a resonant frequency that is smaller than that of the series resonator portion.

A method for manufacturing the piezoelectric filter will now be described with reference to FIGS. 4 and 5 showing sectional views of one of the series and parallel piezoelectric resonator portions in each step. For simplicity, only one element and its associated components are shown in the drawings.

Figure 4A:
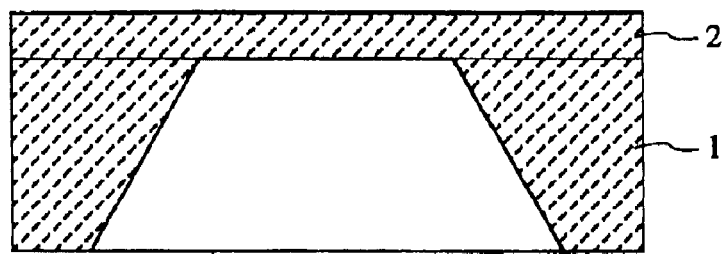
FIG. 4 is an illustration showing sectional views of a resonator in each step of manufacturing the piezoelectric filter of FIG. 1.

As shown in FIG. 4A, the $SiO_2$ layer 2 is formed on one surface of the substrate 1, which is a part of a silicon wafer. The recessed portion extending to the $SiO_2$ layer 2 is then formed in the other surface by an anisotropic etching process.

Figure 4B:
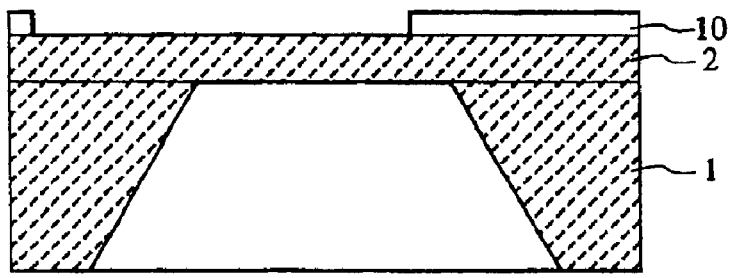

As shown in FIG. 4B, a first resist layer 10 is formed on the $SiO_2$ layer 2 and is then patterned so as to have openings. The resulting first resist layer 10 is used for forming a lower electrode.

Figure 4C:
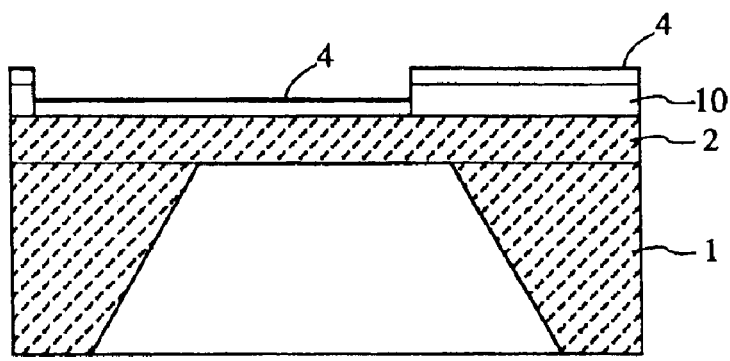

As shown in FIG. 4C, each opening of the first resist layer 10 of the series resonator portion having a higher resonant frequency is masked with a metal mask or the like to form the lower electrode including Al by a vacuum vapor deposition process or a sputtering process so as to have a predetermined thickness.

The metal mask is then removed, and Al is deposited on the entire substrate 1 again by a vacuum vapor deposition process or a sputtering process.

Figure 4D:
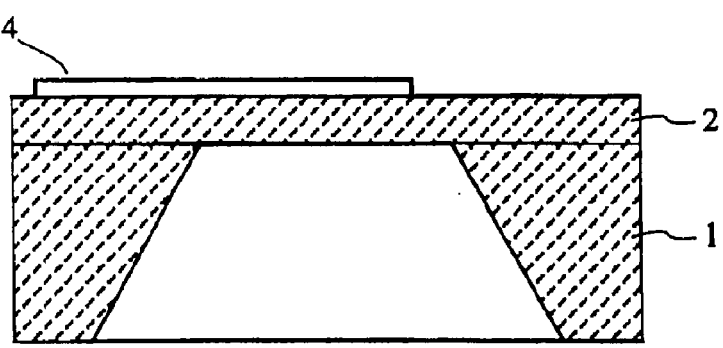

Subsequently, Al on the first resist layer 10 is removed by peeling off the first resist layer 10 using acetone to form the lower electrode 4, as shown in FIG. 4D.

As described above, the lower electrode 4 of the parallel resonator portion is formed by performing the two film-forming steps, and the lower electrode 4 of the series resonator portion is formed by performing the one film-forming step. That is, the time for the film formation of the parallel resonator portion is longer than that of the series resonator portion. Thus, the lower electrode 4 of the parallel resonator portion has a thickness that is larger than that of the lower electrode 4 of the series resonator portion.

According to the above procedure, two types of lower electrodes having different thicknesses can be formed on the silicon wafer with high accuracy.

The two types of lower electrodes having different thicknesses may be formed by the following procedure:

(1) a resist layer on a silicon wafer is patterned so as to have openings for forming the lower electrode of the parallel resonator portions;

(2) a material for the lower electrodes is deposited thereon;

(3) the resist layer is removed;

(4) another resist layer is formed thereon and is then patterned so as to have openings for forming the lower electrode of both the parallel and series resonator portions;

(5) the lower electrode is deposited thereon again; and (6) the latter resist layer is then removed.

Figure 5A:
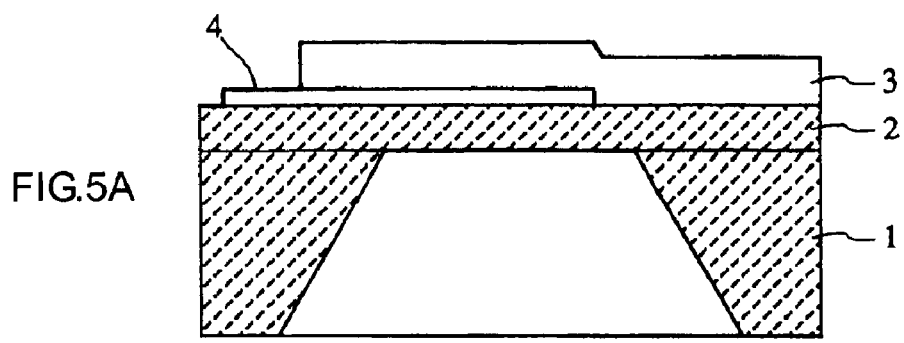
FIG. 5 is an illustration showing sectional views of a resonator in each step of manufacturing the piezoelectric filter of FIG. 1.

As shown in FIG. 5A, the piezoelectric thin-film 3 is formed over the lower electrode 4 and the $SiO_2$ layer 2 by depositing ZnO using a metal mask by a vacuum vapor deposition method or a sputtering method.

Figure 5B:
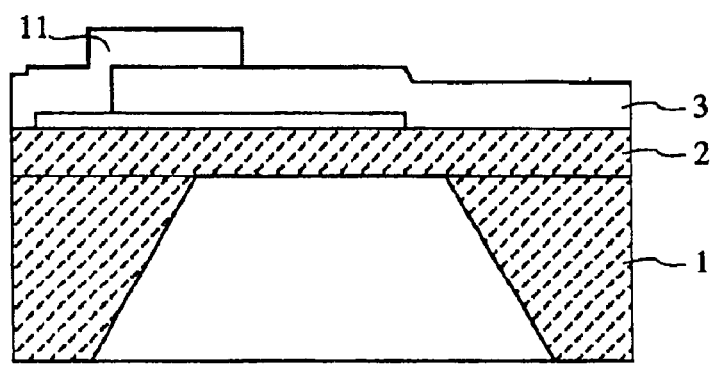

As shown in FIG. 5B, a second resist layer 11 for forming an upper electrode is formed.

Figure 5C:
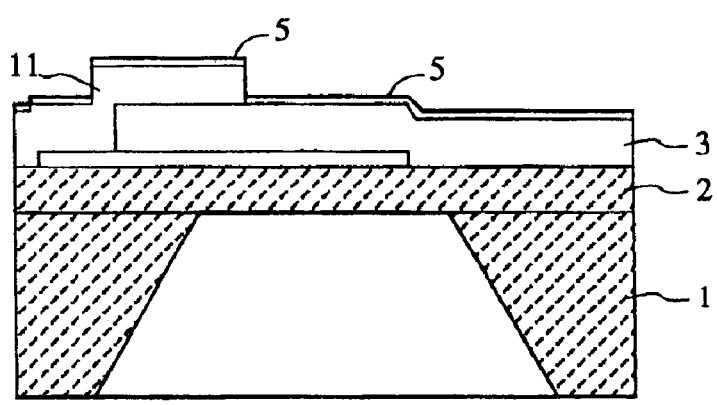
Figure 5D:
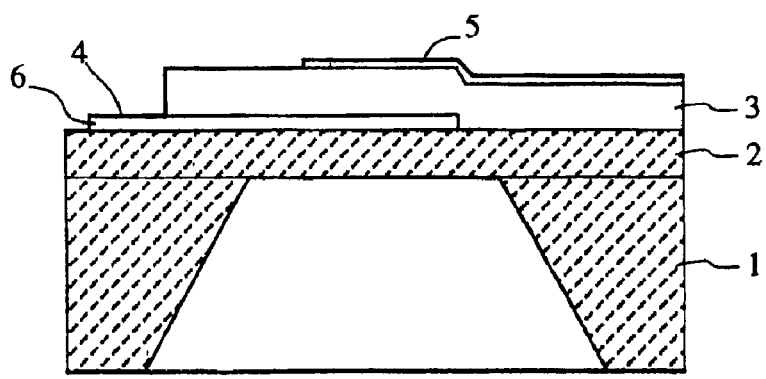

As shown in FIG. 5C, Al is deposited on the entire surface thereof to remove the second resist layer 11, and the upper electrode 5 is then completed, as shown in FIG. 5D.

According to the above procedure, the piezoelectric filter including the parallel and series resonator portions is obtained.

Second Preferred Embodiment

Next, a configuration of another piezoelectric filter according to a second preferred embodiment and a manufacturing method thereof will now be described with reference to FIG. 6.

Figure 6A:
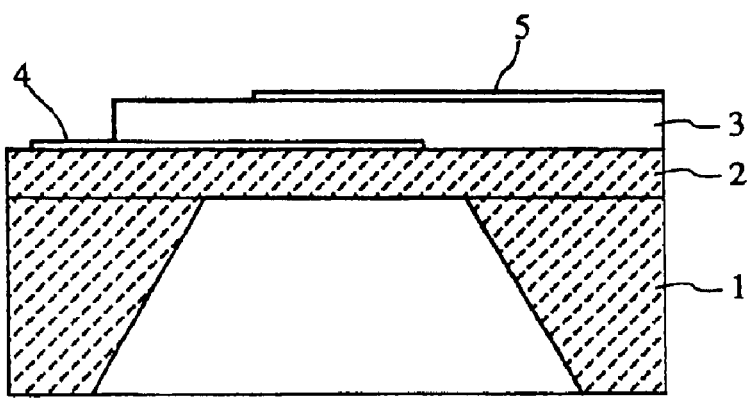
FIG. 6 is an illustration showing sectional views of a series resonator and a parallel resonator in a piezoelectric filter according to a second preferred embodiment of the present invention.
Figure 6B:
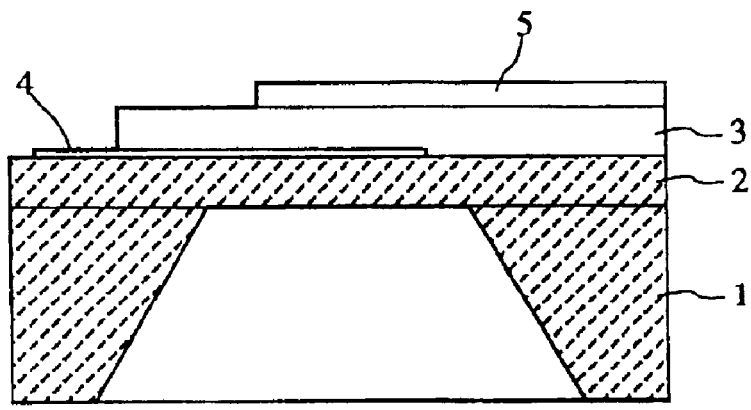

FIG. 6A is a sectional view showing a series resonator portion and FIG. 6B is a sectional view showing a parallel resonator portion. These resonator portions are formed on the same substrate and are separately shown in the figures, however.

The series resonator portion has the same structure as that shown in FIG. 3A. The upper electrode 5 of the parallel resonator portion has a thickness that is larger than that of the series resonator portion.

The thickness of upper electrode 5 is adjusted by performing vacuum vapor deposition or sputtering two times using a metal mask in the same manner as in the first preferred embodiment of the present invention.

In the series and parallel resonator portions, the $SiO_2$ layer 2, the piezoelectric thin-film 3, and the lower and upper electrodes 4 and 5 define a resonant region. Since the resonant region of the parallel resonator portion has a thickness and a mass larger than those of the series resonator portion, the parallel resonator portion has a resonant frequency that is smaller than that of the series resonator portion.

In the first and second preferred embodiments, Al is directly deposited to form the lower electrode 4 or the upper electrode 5. However, in order to improve the adhesion of Al, which is an electrode material, a Ti layer functioning as a base may be formed in advance by a vacuum vapor deposition method or a sputtering method to form an Al layer thereon by such methods.

The electrode material may preferably include Mo, W, Ta, Au, and Pt other than Al.

According to the manufacturing methods of the above-described preferred embodiments, since the thickness of the metal electrodes defining the resonant frequency can be adjusted with high preciseness, the resonant frequency of the parallel resonator can be readily set to a predetermined value and therefore desired filter characteristics can be obtained.

Third Preferred Embodiment

Next, a configuration of a ladder-type piezoelectric filter according to a third preferred embodiment will now be described with reference to FIG. 7.

Figure 7A:
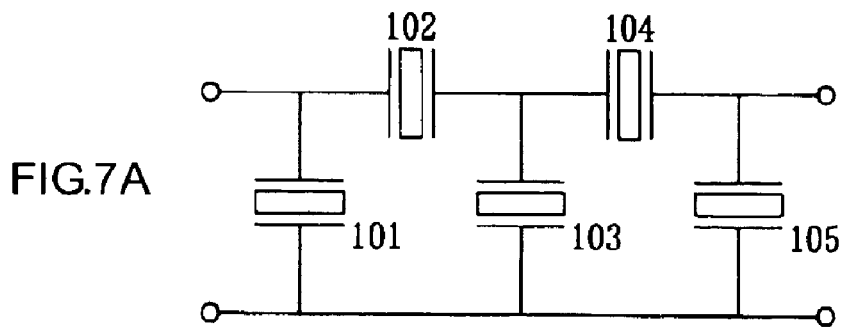
FIG. 7 is an illustration showing a circuit of a ladder-type piezoelectric filter according to a third preferred embodiment of the present invention and a schematic pattern of upper and lower electrodes thereof.
Figure 7B:
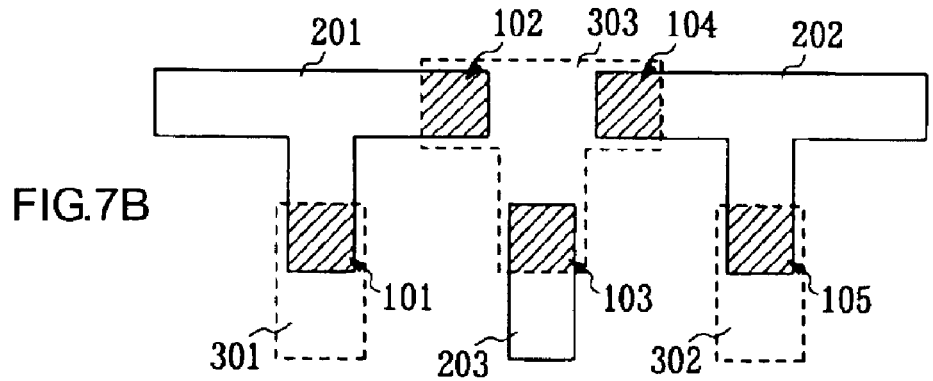

FIG. 7A is an illustration showing a circuit of the ladder-type piezoelectric filter including two series resonators and three parallel resonators, and FIG. 7B is an illustration showing the arrangement of the series and parallel resonators and upper and lower electrodes thereof. In FIG. 7B, the lower electrodes are represented with the solid lines and the upper electrodes are represented with the broken lines. Both the series and parallel resonators are a piezoelectric type. As described in the first preferred embodiment, the series and parallel resonators generate series and parallel resonances, respectively. The filter functions well by adjusting the resonant frequency of the series and parallel resonators.

As shown in FIG. 7, the ladder-type piezoelectric filter has first, second, and third parallel resonators 101, 103, and 105 and first and second series resonators 102 and 104. The first series resonator 102 and the first parallel resonator 101 commonly have a first upper electrode 201, the second series resonator 104 and the third parallel resonator 105 commonly have a second upper electrode 202, and the second series resonator 104 has a third upper electrode 203. The first upper electrode 201 preferably has substantially the same thickness as that of the second upper electrode 202. The third upper electrode 203 has a thickness that is larger than those of the first and second upper electrodes 201 and 202.

The first and second upper electrodes 201 and 202 are preferably formed in the same way as described above. The third upper electrode 203 may be formed simultaneously with the first and second upper electrodes 201 and 202 such that the first, second, and third upper electrodes 201, 202, and 203 have substantially the same thickness, and the thickness of only the third upper electrode 203 is then increased to a predetermined value. Alternatively, the first, second, and third upper electrodes 201, 202, and 203 may be separately formed in different steps so as to have different thicknesses. According to the above procedure, the following configuration can be obtained: the upper electrode of one of the parallel resonators has a thickness that is larger than those of upper electrodes of series resonators.

On the other hand, the first parallel resonator 101 has a first lower electrode 301, the third parallel resonator 105 has a second lower electrode 302, and the first and second series resonator 102 and 104 and the second parallel resonator 103 commonly have a third lower electrode 303. These first, second, and third lower electrodes 301, 302, and 303 are formed in the same way as described above such that the first and second lower electrodes 301 and 302 have a thickness that is larger than that of the third lower electrode 303.

According to the above procedure, the following configuration can be obtained: either an upper electrode or a lower electrode of one of the parallel resonators has a thickness that is larger than those of upper electrodes and lower electrodes of parallel resonators. Thus, the parallel resonator has a resonant frequency that is smaller than that of the series resonator, thereby obtaining the ladder-type piezoelectric filter having predetermined band pass characteristics.

Fourth Preferred Embodiment

Next, a configuration of a ladder-type piezoelectric filter according to a fourth preferred embodiment will now be described with reference to FIG. 8.

Figure 8A:
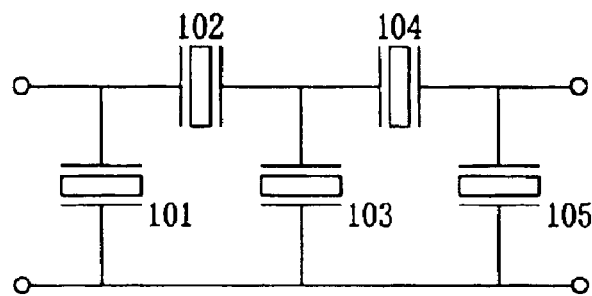
FIG. 8 is an illustration showing a circuit of a ladder-type piezoelectric filter according to a fourth preferred embodiment and a schematic pattern of upper and lower electrodes thereof.

FIG. 8A is an illustration showing a circuit of the ladder-type piezoelectric filter including two series resonators and three parallel resonators, and FIG. 7B is an illustration showing the arrangement of the series and parallel resonators and the upper and lower electrodes thereof. In FIG. 7B, the lower electrodes are represented with the solid lines and the upper electrodes are represented with the broken lines. Both the series and parallel resonators belong to a piezoelectric type.

Figure 8B:
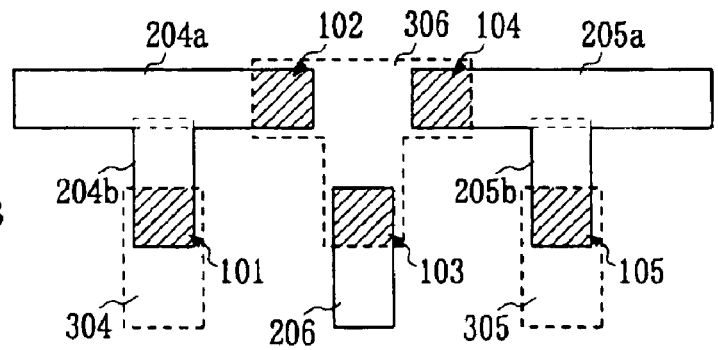

As shown in FIG. 8B, the ladder-type piezoelectric filter has first, second, and third parallel resonators 101, 103, and 105 and first and second series resonators 102 and 104. The first parallel resonator 101 has a fourth lower electrode 304, and the third parallel resonator 105 has a fifth lower electrode 305. The second parallel resonator 103, the first series resonator 102, and the second series resonator 104 commonly have a sixth lower electrode 306. The first parallel resonator 101 has a first parallel upper electrode 204b, the second parallel resonator 103 has a second parallel upper electrode 206, and the third parallel resonator 105 has a third parallel upper electrode 205b. The first series resonator 102 has a first series upper electrode 204a, and the second series resonator 104 has a second series upper electrode 205a.

The fourth, fifth, and sixth lower electrodes 304, 305, and 306 have the same thickness, and the first and second series upper electrodes 204a and 205a also have the same thickness. The first, second, and third parallel upper electrodes 204b, 206, and 205b have the same thickness larger than that of the first and second series upper electrodes 204a and 205a.

The first series upper electrode 204a is electrically connected to the first parallel upper electrode 204b, and the second series upper electrode 205a is electrically connected to the third parallel upper electrode 205b.

The first, second, and third parallel upper electrodes 204b, 206, and 205b are formed simultaneously with the first and second series upper electrodes 204a and 205a by the deposition of an electrode material. Subsequently, the electrode material is deposited on the first, second, and third parallel upper electrodes 204b, 206, and 205b, with the first and second series upper electrodes 204a and 205a masked, to increase the thickness of the first, second, and third parallel upper electrodes 204b, 206, and 205b.

According to the above-described procedure, the lower electrodes can be prepared in one step, that is, a process for manufacturing the piezoelectric filter can be simplified. Thus, the production cost can be reduced.

Other Preferred Embodiments

Figure 9:
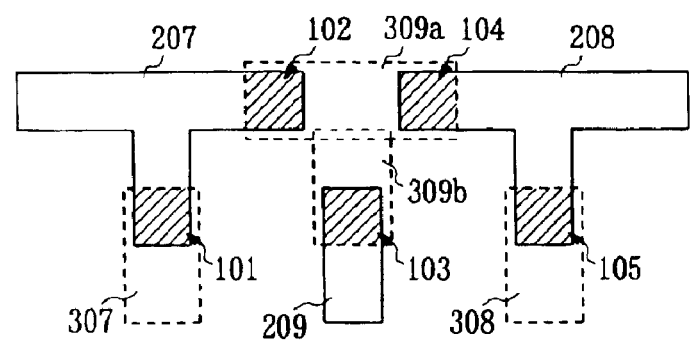
FIG. 9 is an illustration showing a circuit of a ladder-type piezoelectric filter having another configuration and a schematic pattern of upper and lower electrodes thereof.

FIG. 9 shows another ladder-type piezoelectric filter including first, second, and third parallel resonators 101, 103, and 105, and first and second series resonators 102 and 104. The first parallel resonator 101 and the first series resonator 102 commonly have a fourth upper electrode 207, the second series resonator 104 and the third parallel resonator 105 commonly have a fifth upper electrode 208, and the second parallel resonator 103 has a sixth upper electrode 209. The first, second, and third parallel resonators 101, 103, and 105 have first, second, and third parallel lower electrodes 307, 309b, and 308, respectively. The first and second series resonators 102 and 104 commonly have a series lower electrode 309a. The fourth, fifth, and sixth upper electrodes 207, 208, and 209 have the same thickness. The first, second, and third parallel lower electrodes 307, 309b, and 308 have the same thickness larger than that of the series lower electrode 309a.

Figure 10:
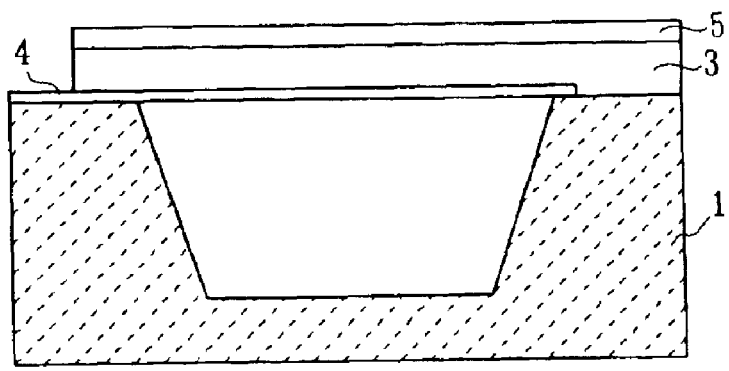
FIG. 10 is an illustration showing sectional views of a series resonator and a parallel resonator in a piezoelectric filter having another configuration.

In the first preferred embodiment, as shown in FIG. 3, the piezoelectric thin-film 3, the lower electrode 4, and the upper electrode 5 are disposed on the back of a surface, having the recessed portion thereon, of the substrate 1. However, as shown in FIG. 10, the piezoelectric thin-film 3, the lower electrode 4, and the upper electrode 5 may be disposed on a surface having the recessed portion thereon.

A piezoelectric resonator having the above configuration is manufactured as follows: a recessed portion is formed in the substrate 1, a resin that can be removed by ashing is packed into the recessed portion, the lower electrode 4 and the piezoelectric thin-film 3 are formed on the substrate surface having the recessed portion, and the resin is removed by ashing.

Figure 11A:
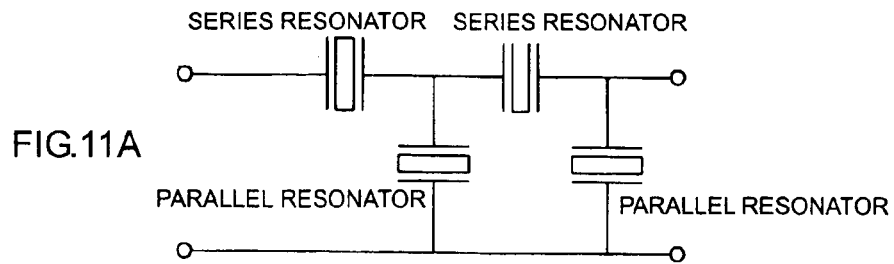
FIG. 11 is an illustration showing a circuit of a ladder-type piezoelectric filter including a plurality of piezoelectric resonators.
Figure 11B:
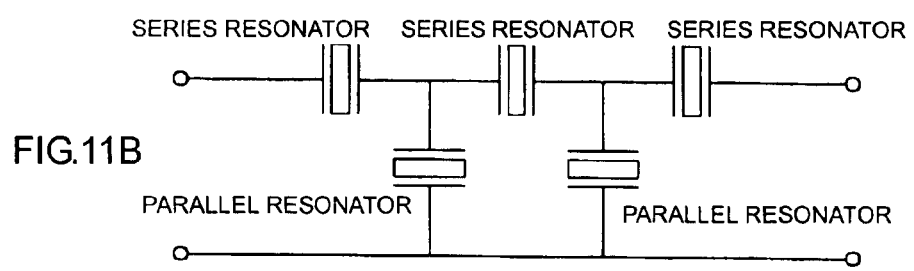
Figure 11C:
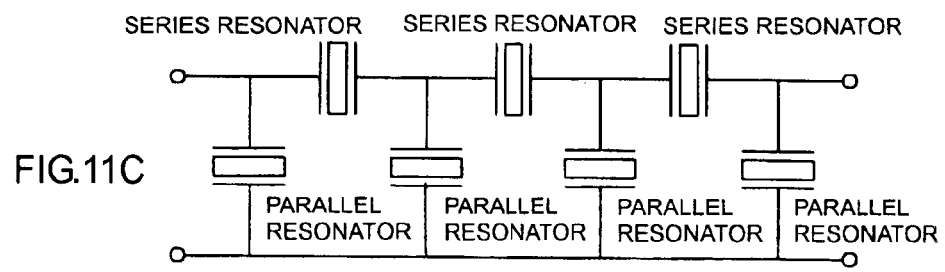

In the above preferred embodiments, the piezoelectric filter having a parallel resonator and a series resonator and the ladder-type piezoelectric filters having two series resonators and three parallel resonators are described. However, a ladder-type piezoelectric filter may include a plurality of series resonators and parallel resonators arranged as shown in FIG. 11. Such a ladder-type piezoelectric filter can provide desired characteristics.

Figure 12:
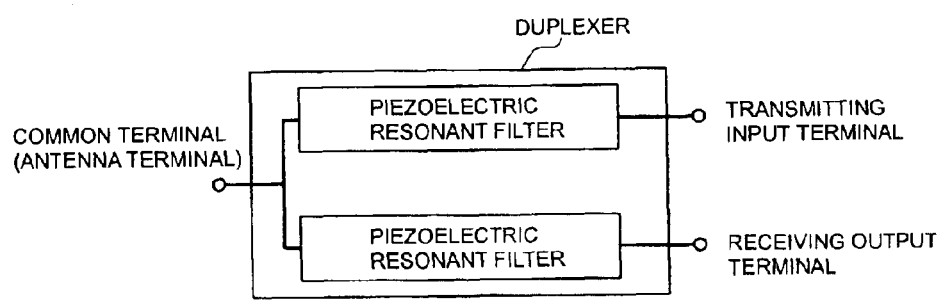
FIG. 12 is a schematic view of a duplexer including a piezoelectric filter.

FIG. 12 shows a duplexer including two piezoelectric filters, which are any of the above-described piezoelectric filters according to preferred embodiments of the present invention. In the duplexer, an output terminal of one piezoelectric filter functioning as a transmitter is connected to an input terminal of the other piezoelectric filter functioning as a receiver to form a common terminal. In the transmitting piezoelectric filter and the receiving piezoelectric filter of the duplexer, the upper and lower electrodes have different thicknesses, thereby achieving different band pass characteristics.

In the piezoelectric filters described above, the upper electrodes of the parallel resonators have a thickness that is larger than that of those of the series resonators or the lower electrodes of the parallel resonators have a thickness larger than that of those of the series resonators. However, the upper electrodes of the parallel resonators may have a thickness that is smaller than that of those of the series resonators or the lower electrodes of the parallel resonators may have a thickness that is larger than that of those of the series resonators. In a piezoelectric filter having such a configuration, the parallel resonators have a resonant frequency that is higher than that of the series resonators. Such a piezoelectric filter functions as a notch filter.

Since the above piezoelectric filter has band-pass characteristics, the piezoelectric filter is suitable for high-frequency circuits such as electronic tuning circuits, modulator circuits, and other circuits for removing interfering waves, wherein the high-frequency circuits are used for communication devices.

According to various preferred embodiments of the present invention, upper or lower electrodes can be formed with high pattern preciseness so as to adjust the resonant frequency.

Since a conventional thin-film, not in contact with a piezoelectric resonator, for adjusting the resonant frequency is not required, the deterioration of the resonant characteristics caused by the electrical coupling of the thin-film and the piezoelectric resonator does not arise.

Since a change in the resonant frequency with respect to the thickness of the upper and lower electrodes can be increased, the ratio of the thickness of the piezoelectric thin-film to the thickness of the upper or lower electrodes is not significantly changed. Therefore, the temperature characteristics of the resonant frequency of piezoelectric resonator portions having a relatively low resonant frequency and other piezoelectric resonator portions are not significantly changed, thereby obtaining the stable filter characteristics against change in temperature.

When a substrate has an opening or a recessed portion and a vibrating portion is disposed in the opening or the recessed portion, the resonant frequency can be set to a predetermined value by adjusting the mass of the vibrating portion to an appropriate value.

In a piezoelectric filter including a plurality of series resonators and parallel resonators connected in a ladder configuration, a step for forming electrodes can be simplified by setting upper and lower electrodes to have substantially the same thickness, thereby reducing the production cost.

When the piezoelectric filter is used for a component for processing transmitting or receiving signals, the stable communication characteristics against change in the temperature of the surroundings can be obtained.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric filter comprising:
    a plurality of piezoelectric resonator portions each including a substrate and a vibrating portion disposed on the substrate, having upper and lower electrodes and a thin-film portion disposed between the upper and lower electrodes, having a piezoelectric thin-film;
    wherein the plurality of piezoelectric resonator portions include piezoelectric resonator portions having a relatively low frequency, and the lower electrodes of the piezoelectric resonator portions having a relatively low frequency have a larger thickness than that of lower electrodes of other piezoelectric resonator portions; and
    wherein the lower electrodes of the plurality of piezoelectric resonator portions comprise a single layer.

2. The piezoelectric filter according to claim 1, wherein the substrate has one of an opening and a recessed portion, and the vibrating portion is disposed in the one of the opening and the recessed portion.

3. A communication device comprising the piezoelectric filter according to claim 1.

4. A piezoelectric filter comprising:
    a plurality of piezoelectric resonator portions, connected to one another so as to define a ladder configuration, each including a substrate and a vibrating portion disposed on the substrate, having upper and lower electrodes and a thin-film portion disposed between the upper and lower electrodes, having a piezoelectric thin-film;
    wherein the plurality of piezoelectric resonator portions include piezoelectric resonator portions connected in parallel and piezoelectric resonator portions connected in series, the upper electrodes of the plurality of piezoelectric resonator portions have the same thickness, and the lower electrodes of the parallel piezoelectric resonator portions have a thickness that is different from that of the lower electrodes of the series piezoelectric resonator portions; and
    wherein the lower electrodes of the plurality of piezoelectric resonator portions comprise a single layer.

5. A communication device comprising the piezoelectric filter according to claim 4.

6. The piezoelectric filter according to claim 4, wherein the lower electrodes of the parallel piezoelectric resonator portions have a thickness that is larger than that of the lower electrodes of the series piezoelectric resonator portions.

7. The piezoelectric filter according to claim 4, wherein the substrate has one of an opening and a recessed portion, and the vibrating portion is disposed in the one of the opening and the recessed portion.

8. A method for manufacturing a piezoelectric filter including a plurality of piezoelectric resonator portions each including a substrate and a vibrating portion disposed on the substrate, having upper and lower electrodes and a thin-film portion disposed between the upper and lower electrodes, having a piezoelectric thin-film, the method comprising the step of:
    forming the lower electrodes;
    wherein the plurality at piezoelectric resonator portions include piezoelectric resonator portions having a relatively low frequency, and a time for forming the lower electrodes of the piezoelectric resonator portions having a relatively low frequency is longer than that required for forming lower electrodes of other piezoelectric resonator portions; wherein
    the lower electrodes of the plurality of piezoelectric resonator portions comprise a single layer.

9. A method for manufacturing a piezoelectric filter according to claim 8, wherein each of the upper and the lower electrodes of the piezoelectric resonators portions are formed by a vacuum vapor deposition process.

10. A method for manufacturing a piezoelectric filter including a plurality of piezoelectric resonator portions each including a substrate and a vibrating portion disposed on the substrate, having upper and lower electrodes and a thin-film portion disposed between the upper and lower electrodes, having a piezoelectric thin-film, the method comprising the step of:
    forming the lower electrodes;
    wherein the plurality of piezoelectric resonator portions include piezoelectric resonator portions having a relatively low frequency, and the time for forming the upper electrodes of the piezoelectric resonator portions having a relatively low frequency is longer than that required for forming upper electrodes of other piezoelectric resonator portions; wherein
    the upper electrodes of the plurality of piezoelectric resonator portions comprise a single layer.

11. A method for manufacturing a piezoelectric filter according to claim 10, wherein each of the upper and the lower electrodes of the piezoelectric resonators portions are formed by a vacuum vapor deposition process.

12. A method for manufacturing a piezoelectric filter including a plurality of piezoelectric resonator portions connected to one another so as to form a ladder configuration, each including a substrate and a vibrating portion disposed on the substrate, having upper and lower electrodes and a thin-film portion disposed between the upper and lower electrodes, having a piezoelectric thin-film, the method comprising the steps of:

forming the lower electrodes of the piezoelectric resonator portions including piezoelectric resonator portions connected in parallel and piezoelectric resonator portions connected in series such that the lower electrodes of the parallel piezoelectric resonator portions have a thickness that is different from that of the lower electrodes of the series piezoelectric resonator portions; and forming the upper electrodes of the parallel piezoelectric resonator portions and the upper electrodes of the series piezoelectric resonator portions at the same time; wherein the lower electrodes of the plurality of piezoelectric resonator portions comprise a single layer.

13. A method for manufacturing a piezoelectric filter according to claim 12, wherein each of the upper and the lower electrodes of the piezoelectric resonators portions are formed by a vacuum vapor deposition process.

14. A method for manufacturing a piezoelectric filter including a plurality of piezoelectric resonator portions connected to one another so as to form a ladder configuration, each including a substrate and a vibrating portion disposed on the substrate, having upper and lower electrodes and a thin-film portion disposed between the upper and lower electrodes, having a piezoelectric thin-film, the method comprising the steps of:

forming the lower electrodes of the piezoelectric resonator portions including piezoelectric resonator portions connected in parallel and other piezoelectric resonator portions connected in series such that the lower electrodes of the parallel piezoelectric resonator portions have a thickness that is larger than that of the lower electrodes of the series piezoelectric resonator portions; and forming the upper electrodes of the parallel piezoelectric resonator portions and the upper electrodes of the series piezoelectric resonator portions at the same time; wherein the lower electrodes of the plurality of piezoelectric resonator portions comprise a single layer.

15. A method for manufacturing a piezoelectric filter according to claim 14, wherein each of the upper and the lower electrodes of the piezoelectric resonators portions are formed by a vacuum vapor deposition process.

\* \* \* \* \*